(12) United States Patent
Van Holland

(10) Patent No.: US 9,019,008 B2
(45) Date of Patent: Apr. 28, 2015

(54) CLASS D AMPLIFIERS

(71) Applicant: NXP B.V., Eindhoven (NL)

(72) Inventor: Gertjan Van Holland, Ede (NL)

(73) Assignee: NXP, B.V., Eindhoven (NL)

( * ) Notice: Subject to any disclaimer, the term of this patent is extended or adjusted under 35 U.S.C. 154(b) by 138 days.

(21) Appl. No.: 13/848,637

(22) Filed: Mar. 21, 2013

(65) Prior Publication Data

US 2013/0271214 A1  Oct. 17, 2013

(30) Foreign Application Priority Data

Apr. 16, 2012 (EP) ..................................... 12164313

(51) Int. Cl.
  *H03F 3/38* (2006.01)
  *H03F 3/217* (2006.01)
(52) U.S. Cl.
  CPC ................................... *H03F 3/2178* (2013.01)
(58) Field of Classification Search
  CPC .............................. H03F 3/2178; H03F 3/38
  USPC ............................................. 330/207 A, 251
  See application file for complete search history.

(56) References Cited

U.S. PATENT DOCUMENTS

| 6,175,272 | B1 | 1/2001 | Takita | |
|---|---|---|---|---|
| 6,300,825 | B1 | 10/2001 | Dijkmans et al. | |
| 7,102,405 | B2 * | 9/2006 | Hisamoto et al. | 327/172 |
| 7,948,313 | B2 * | 5/2011 | Tsuji et al. | 330/251 |
| 2004/0160271 | A1 | 8/2004 | Fukushima | |
| 2006/0202754 | A1 | 9/2006 | Yamamura et al. | |
| 2008/0284511 | A1 | 11/2008 | De Cremoux | |
| 2010/0102881 | A1 | 4/2010 | Kirn | |

FOREIGN PATENT DOCUMENTS

WO  00/33448 A2  6/2000

OTHER PUBLICATIONS

Flinders, F. M. et al. "Improved Techniques for Switching Power Amplifiers," IEEE Trans. on Power Electronics, vol. 8, No. 4, pp. 673-679 (1993).
Nielsen, K. "Parallel Phase-Shifted Carrier Pulse Width Modulation (PSCPWM)—A Novel Approach to Switching Power Amplifier Design", Proc. 102nd AMS Convention, 26 pgs (1997).
Philips, K. et al. "PowerDAC: A Single-Chip Audio DAC with a 70%-Efficient Power Stage in 0.5 µm CMOS", IEEE Intl. Solid-State Circuits Conf., Dig. of Tech. Papers, pp. 154-155 (1999).
Berkhout, M., "An Integrated 200-W Class-D Audio Amplifier", IEEE J. of Solid-State Circuits, vol. 38, No. 7, pp. 1198-1206 (Jul. 2003).
Antunes, V. M. E. et al. "Digital Audio Power Amplifier Based on Multi-Level Power Converters", Proc. AES $27^{th}$ Intl. Conf., 9 pgs. (Sep. 2005).
Extended European Search Report for European Patent Appln. No. 12164313.4 (Sep. 19, 2012).

* cited by examiner

*Primary Examiner* — Steven J Mottola

(57) ABSTRACT

A 3-level class D amplifier circuit comprises a first comparator for comparing an input with a first triangular reference and a second comparator for comparing the input with a second triangular reference. A phase relationship between the signals to the first comparator is 180 degrees shifted relative to a phase relationship between the signals to the second comparator. An amplifier stage generates a three-level PWM output signal using the outputs of the first and second comparators. A shared feedback path is used from the three-level PWM output signal.

12 Claims, 6 Drawing Sheets

CLASS D AMPLIFIERS

CROSS-REFERENCE TO RELATED APPLICATIONS

This application claims the priority under 35 U.S.C. § 119 of European patent application no. 12164313.4, filed on Apr. 16, 2012, the contents of which are incorporated by reference herein.

This invention relates to Class D amplifiers.

BACKGROUND OF THE INVENTION

For consumer mobile devices and automotive audio devices, customers expect good sound quality, high output power, low distortion and long-term battery life. Class-D amplifiers are suitable for this type of application.

Class D amplifiers use nonlinear amplification that involves switching of the output between discrete voltage levels.

The benefit of class-D amplification over linear amplification is that there is less power dissipation or higher efficiency in the amplifier, for example >90%, compared to linear amplifier types such as class-A, -AB or -B. A class-AB amplifier has a typical efficiency of 78.5% for a sine wave and about 25% for music signals.

Most present class-D amplifiers comprise a modulator, a power stage and a low pass filter at the output. The modulator converts the input signal into a Pulse Width Modulated (PWM) signal that is used to drive the power stage. The low frequency content of the PWM signal represents the desired output signal of the class-D amplifier and a low pass filter is used to reconstruct the desired output signal.

Normally, a low loss second or higher order LC filter is used, but the use of an inductor coil is undesirable because it is expensive, bulky and non-linear. Depending on the characteristics of the loudspeaker used, the efficiency of a 2-level filterless class-D amplifier is reduced compared to a filtered class-D amplifier because the load has to handle the high frequency energy of the PWM signal.

FIG. 1 shows the load current of a filtered and non-filtered PWM signal and shows a PWM voltage generated at the output of a CMOS pull-up and pull-down stage 10. The square wave PWM voltage 12 across the load results in a square wave load current in the absence of any filtering (load current 14), whereas the current is smoothed (load current 16) by the inductor when an inductive filter is used.

The efficiency of a filterless or filtered class-D system can be improved if multiple output levels are used, instead of a two-level system as shown in FIG. 1.

There are several ways to generate PWM signals. They can be categorized as two main approaches:

1. Fixed carrier PWM modulation

Carrier-based PWM is a well-known method. A fixed frequency is used to sample the input signal. Two main types of carrier-based PWM are applicable: natural sampling (NPWM) and uniform sampling (UPWM).

2. Variable carrier PWM modulation

Self-oscillation is the most commonly known principle used by a variable carrier modulator.

FIG. 2 shows a 2-level fixed carrier pulse width modulation scheme.

In general a fixed carrier N-level PWM modulator is preferred because the fixed carrier signals result in a known frequency spectrum of the output signal.

In FIG. 2, a sinusoidal input $V_S$ is compared with a symmetrical triangular waveform $V_T$ by a comparator 20. The crossing point of the two input signals determines the timing at which switching between the two levels of the output occurs.

The ratio between the amplitude of the (sinusoidal) input signal, $V_S$, and amplitude of the triangular wave, $V_T$, is called the modulation depth, $\Delta$.

$$V_{INPUT} = V_S \cdot \cos(\omega_S t)$$

$$\Delta = \frac{V_S}{V_T}$$

The 2-level PWM signal, F(t), obtained from a sinusoidal input signal that is compared with a reference triangle can be expanded in a Fourier series:

$$F(t) = \Delta\cos(y) + 2\sum_{m=1}^{\infty} \frac{J_0\left(m\pi\frac{\Delta}{2}\right)}{\frac{m\pi}{2}}\sin\left(\frac{m\pi}{2}\right)\cos(mx) +$$

$$2\sum_{m=1}^{\infty}\sum_{n=\pm1}^{\infty} \frac{J_n\left(m\pi\frac{\Delta}{2}\right)}{\frac{m\pi}{2}}\sin\left(\frac{(m+n)\pi}{2}\right)\cos(mx+ny)$$

| | |
|---|---|
| $\Delta$ | Modulation depth, $\Delta \in [0, 1]$ |
| $x = \omega_C t$ | Carrier signal frequency |
| $y = \omega_S t$ | Audio signal frequency |
| $J_N$ | Bessel function of order $N$ |
| $n$ | Audio Signal harmonics index |
| $m$ | Carrier Signal harmonics index |

A multi-level PWM signal, FN(t), is able to represent the desired output signal more accurately. A multi-level PWM signal can also be expanded using a Fourier series:

$$F_N(t) = \Delta\cos(y) + 2\sum_{m\in\{N,2N,3N,\dots\}} \frac{J_0\left(m\pi\frac{\Delta}{2}\right)}{\frac{m\pi}{2}}\sin\left(\frac{m\pi}{2}\right)\cos(mx) +$$

$$2\sum_{m\in\{N,2N,3N,\dots\}}\sum_{n=\pm1}^{\infty} \frac{J_n\left(m\pi\frac{\Delta}{2}\right)}{\frac{m\pi}{2}}\sin\left(\frac{(m+n)\pi}{2}\right)\cos(mx+ny)$$

| | |
|---|---|
| $\Delta$ | Modulation depth, $\Delta \in [0, 1]$ |
| $x = \omega_C t$ | Carrier signal frequency |
| $y = \omega_S t$ | Audio signal frequency |
| $J_N$ | Bessel function of order $N$ |
| $n$ | Audio Signal harmonics index |
| $m$ | Carrier Signal harmonics index |
| $N$ | Number of PWM levels |

In general, the generation of an N-level PWM signal requires (N−1) phase shifted reference carrier signals. The phase shift of the different N−1 carriers is set as:

$$\Phi_P = p\frac{2\pi}{N-1},$$
$$p \in [0, N-2]$$

This invention relates to multi-level class-D amplifiers.

It has been proposed to provide a five voltage level class-D system built-up by using two 3-level power stages configured in a bridge tied load configuration.

This configuration is shown in FIG. 3.

Each 3-level stage comprises three transistors each connected between a respective power supply and a common node. The first 3-level power stage P (P=plus) comprises transistors $M_{HP}$ (HP=high, plus) connected between the node 30 and a high voltage rail $V_{DD}$, $M_{MP}$ (MP=mid, plus) connected between the node 30 and a middle voltage $V_{DD}/2$, and $M_{LP}$ (LP=low, plus) connected between the node 30 and a low voltage rail GND.

The second 3-level power stage M (M=minus) comprises transistors $M_{HM}$ (HM=high, minus) connected between the node 32 and the high voltage rail $V_{DD}$, $M_{MM}$ (MM=mid, minus) connected between the node 32 and the middle voltage $V_{DD}/2$, and $M_{LM}$ (LM=low, minus) connected between the node 32 and the low voltage rail GND.

This uses a pair of 3-level power stages. It is noted that a 2-level class-D power stage can be used for a three level class-D amplifier by choosing another modulation method, BD. BD is a 3 level modulation instead of 2 level AD modulation, which is configured in bridge tied load configuration. The difference between AD and BD mode is visualized in FIG. 4a, which shows a simplified representation of AD and BD modulation.

In an AD modulation scheme, inverted reference signals are applied to two comparators, which receive the differential input signals. This means the crossing points of the two comparators correspond in time. In a BD modulation scheme, the same reference signals are applied to the two comparators with the effect that the crossing points arise at different times. These differences enable a three level signal to be derived.

FIG. 4b shows timing diagrams for AD modulation and FIG. 4c shows timing diagrams for BD modulation.

Power stage errors introduced by the switching power stage cause distortion, and they can be categorized into Pulse Timing Errors [PTE] and Pulse Amplitude Errors [PAE].

The essential sources of Pulse Timing Errors are:

(i) Difference in delay between turn-on and turn-off. The delays from turn-on or turn-off to the actual PWM level voltage transition are different. The delays depend on various parameters in the Power MOSFET physics and driver hardware and are complex to analyze and impossible to correct directly by tuning.

(ii) Deadtime. This is the blanking delay between a turn-off and the following turn-on.

(iii) Current dependent rise and fall times. The slopes of the edges of the PWM signal are different in rising and falling edges, and they depend on the present current through the power switches.

(iv) Overshoot and ringing of the edges of the PWM pulse. The surface of the PWM pulse is changed when overshoot and ringing are added to the required PWM pulse.

Pulse Amplitude Errors are constituted by:

(i) Power supply perturbations. Since the power supply level directly generates the PWM waveform, any power supply variation will influence the modulated audio signal.

(ii) Non-zero power switch impedance. The impedance of the switch during the on period is not zero. Non-zero power switch impedance will not necessarily lead to harmonic distortion or extra noise. Errors do result if the switching impedances of the three power transistors are different.

The control of a class D amplifier can use a feedforward approach or a feedback approach. Applying feedback minimizes the errors outlined above.

However, the implementation of a feedback control loop for a multi-level class-D amplifier is complicated, and feedforward control systems are generally used.

SUMMARY OF THE INVENTION

According to the invention, there is provided a circuit as claimed in the independent claim.

According to the invention, there is provided an N-level class D amplifier circuit comprising:

a first comparator for comparing a first signal derived from an input voltage signal with a first reference signal in the form of a first triangular waveform;

a second comparator for comparing a second signal derived from the input voltage signal with a second reference signal in the form of a second triangular waveform, wherein a phase relationship between the signals to the first comparator is phase shifted relative to a phase relationship between the signals to the second comparator;

an amplifier stage for generating the N-level PWM output signal;

a controller for controlling the amplifier stage based on the outputs of the first and second comparators; and a feedback path from the N-level PWM output signal.

This circuit implements feedback control in a circuit with two comparators, which together enable an N-level PWM signal to be generated. A single main feedback path is provided from the output to the input and this enables errors to be corrected, such as errors arising from changes in the supply voltage.

In a preferred example, N=3 and a phase relationship between the signals to the first comparator is 180 degrees shifted relative to a phase relationship between the signals to the second comparator. This 3-level circuit can be used as a building block to enable multiple level circuits to be formed.

A voltage to current converter can be provided at the input of the circuit to generate an input current, and a first integrator for converting the input current back to a voltage. The feedback path then connects to the output of the voltage to current converter. The feedback path thus injects a feedback current to the first integrator to adapt the current to voltage conversion implemented by the integration function, to provide compensation for errors.

The output of the first integrator or current to voltage converter can be supplied to the first and second comparators. The first triangular waveform can be generated by a first triangular waveform generator and the second triangular waveform can be 180 degrees out of phase with respect to the first triangular waveform and is generated by a second triangular waveform generator.

For example, the first triangular waveform generator can comprise a second integrator which receives at its input a square wave oscillator signal. A first impedance (functioning as a passive voltage to current converter) can be provided between the output of the first integrator and the input to the second integrator. This provides second order feedback control to improve the gain function of the circuit.

Similarly, the second triangular waveform generator can comprise a third integrator which receives at its input a 180 degree phase shifted version of the square wave oscillator signal. A second impedance (functioning as a passive voltage to current converter) can then be provided between the output of the first integrator and the input to the third integrator.

The main feedback path can comprise a feedback impedance coupled between the circuit output and the input to the first integrator.

The invention also provides a 5-level class D amplifier circuit comprising:

a first 3-level class D amplifier circuit of the invention;

a second 3-level class D amplifier circuit of the invention; and wherein the output of one of the 3-level class D amplifier circuits is subtracted from the other.

By using the same reference voltage values for the comparators in each 3-level circuit, 5 levels are available. However, two 3-level circuits can also be combined to provide 7 levels by using different reference voltages to the comparators.

The loudspeaker or load impedance can provide the subtraction function, by arranging the circuit in a bridge tied load configuration.

The first and second reference signals of one of the 3-level class D amplifier circuits are shifted by 90 degrees with respect to the first and second reference signals of the other of the 3-level class D amplifier circuits. In this way, the two 3-level circuits define two different 3-level PWM outputs which subtract to form the desired 5-level signal.

In one example, the invention can also be used to provide a 5-level circuit without using a bridge tied load. In this case, a third comparator is provided for comparing a third signal derived from an input voltage signal with a third reference signal in the form of a first triangular waveform; and a fourth comparator is provided for comparing a fourth signal derived from the input voltage signal with a fourth reference signal in the form of a second triangular waveform, wherein a phase relationship between the signals to the third and fourth comparators is 90 degrees shifted relative to a phase relationship between the signals to the first and second comparators.

BRIEF DESCRIPTION OF THE DRAWINGS

Examples of the invention will now be described in detail with reference to the accompanying drawing, in which.

DETAILED DESCRIPTION OF THE EMBODIMENTS

The invention provides a class D amplifier circuit comprising a first comparator for comparing an input with a first triangular reference and a second comparator for comparing the input with a second triangular reference. A phase relationship between the signals to the first comparator is 180 degrees shifted relative to a phase relationship between the signals to the second comparator. An amplifier stage generates a three-level PWM output signal using the outputs of the first and second comparators. A shared feedback path is used from the three-level PWM output signal.

The invention is based on a modular approach to the design of a feedback control system for a multi-level class D amplifier.

Figure 5:
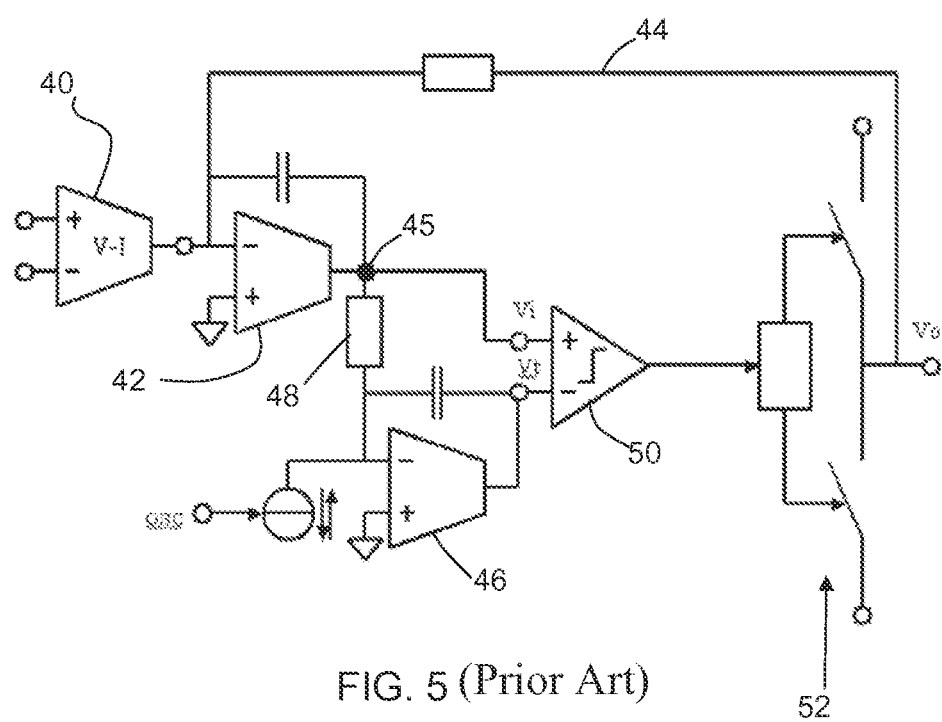
FIG. 5 shows a known feedback control circuit for controlling a 2-level or 3-level class D amplifier circuit.

FIG. 5 shows a known class-D control loop that is suitable for 2 or 3 level class-D amplifier. This circuit is described in the paper by Berkhout, Marco, "An Integrated 200-W class-D Audio Amplifier" in IEEE Journal of Solid-State Circuits, Volume 38, Number 7, July 2003. pp. 1198-1206. The feedback loop is also described in U.S. Pat. No. 6,300,825.

The control circuit comprises a voltage to current converter (analog or digital) 40 (a transconductance amplifier) for providing an input current. This is fed to a first integrator 42, implemented as an operational amplifier with capacitive feedback, which combines the input current with a feedback current derived from a feedback loop 44 from the PWM output. Thus, the voltage at the output node 45 comprises a version of the input voltage which has been modified by the feedback control loop.

The triangular waveform Vt is generated by integrating a square wave oscillator signal "osc" using a second integrator 46, again implemented as an operational amplifier with capacitive feedback.

The first integrator 42 implements a first order feedback control loop. The resistor 48 couples the output 45 of the first integrator 42 to the input of the second integrator 46, and this implements a second order control.

The comparator 50 provides the control signals for controlling the output stage 52 which then generates the PWM output voltage Vo. The output stage is shown schematically with two transistors for two-level control, but there may be three transistors for three-level control.

The invention will be explained with reference to a 5-level system, although the invention can be scaled for more levels.

The equations above show that four different reference carrier signals are needed with a phase shift of 0°, 90°, 180° and 270° respectively.

Figure 6:
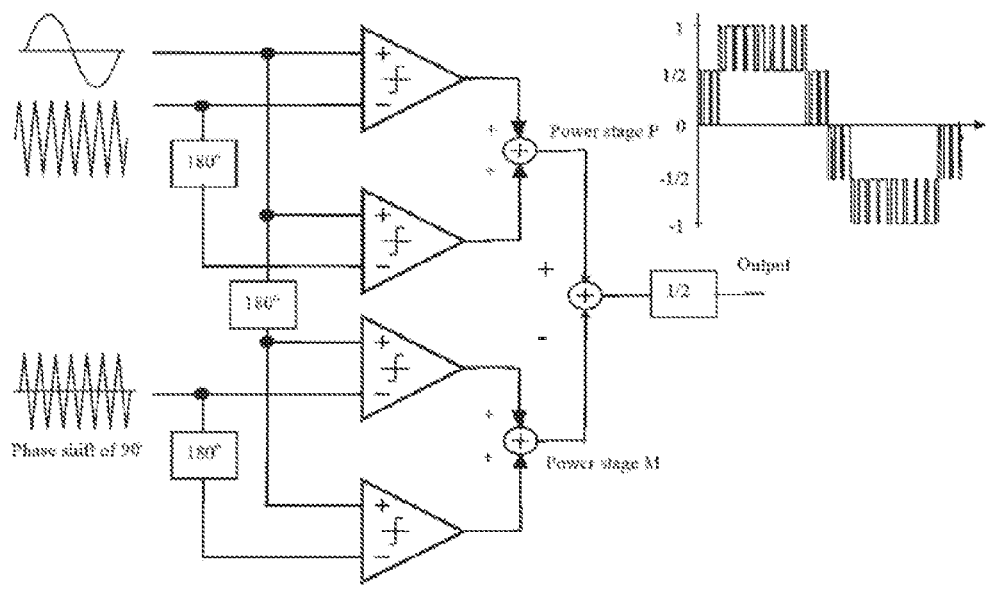
FIG. 6 shows how a 5-level class D amplifier circuit can be based on two 3-level class D amplifier circuits.

FIG. 6 shows how these four reference carrier signals can be combined to derive a 5-level PWM signal, based on phase shifting of the input and reference signal.

It is noted that this combination of phase shifted signals is shown in the paper by Nielsen, Karsten, "Parallel Phase Shifted Carrier Pulse Width Modulation [PSCPWM]—A Novel Approach to Switching Power Amplifier Design" presented at the 102$^{nd}$ AES Convention. Munich, Germany. Mar. 22-25, 1997.

The circuit essentially comprises two 3-level circuits, named Power stage P (Plus) and Power stage M (Minus). Each power stage has two comparators, with the same input signal applied, but the reference triangular waveform shifted by 180 degrees. The input signal to one power stage is 180 degree phase shifted with respect to the other, and the triangular waveform is 90 degree phase shifted.

In this way, all four 90 degree phases of the triangular waveform are used, and two opposite phases of the input signal.

FIG. 6 shows how subtraction of one power stage output from the other generates a 5-level PWM signal that follows the sinusoidal input signal. Thus, the desired 5-level power stage can be obtained by using two 3-level power stages configured in bridge tied load [BTL] to implement the subtraction.

The invention in this aspect provides a control loop for each of the two 3-level power stages in FIG. 5. This 3-level design can be scaled by adding more comparators and phase shifted reference input signals as derived in the equations above. This is discussed further below.

Figure 7:
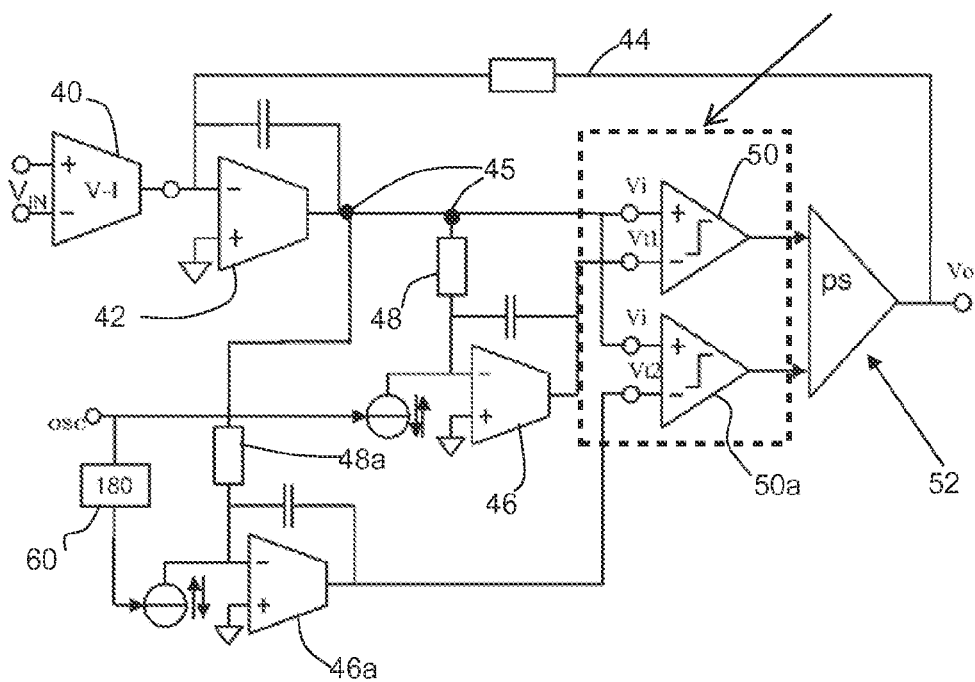
FIG. 7 shows an example of control circuit, including feedback, of the invention for controlling a 3-level class D amplifier circuit, and which can be combined in modular form to control a 5-level amplifier circuit.

The 3-level control loop is shown in FIG. 7. As explained with reference to FIG. 6, a 5-level class-D amplifier can be obtained with two such 3-level control loops, with the 3-level power stages configured in BTL mode.

The circuit of FIG. 7 is a modification to the circuit of FIG. 5, with an additional triangular waveform generator to generate a second triangular waveform 180 degrees out of phase with the first, and a second comparator.

The same reference numbers are used as in FIG. 5 for the same components. The triangular reference Vt shown in FIG. 5 is represented as Vt1 in FIG. 7.

Figure 1:
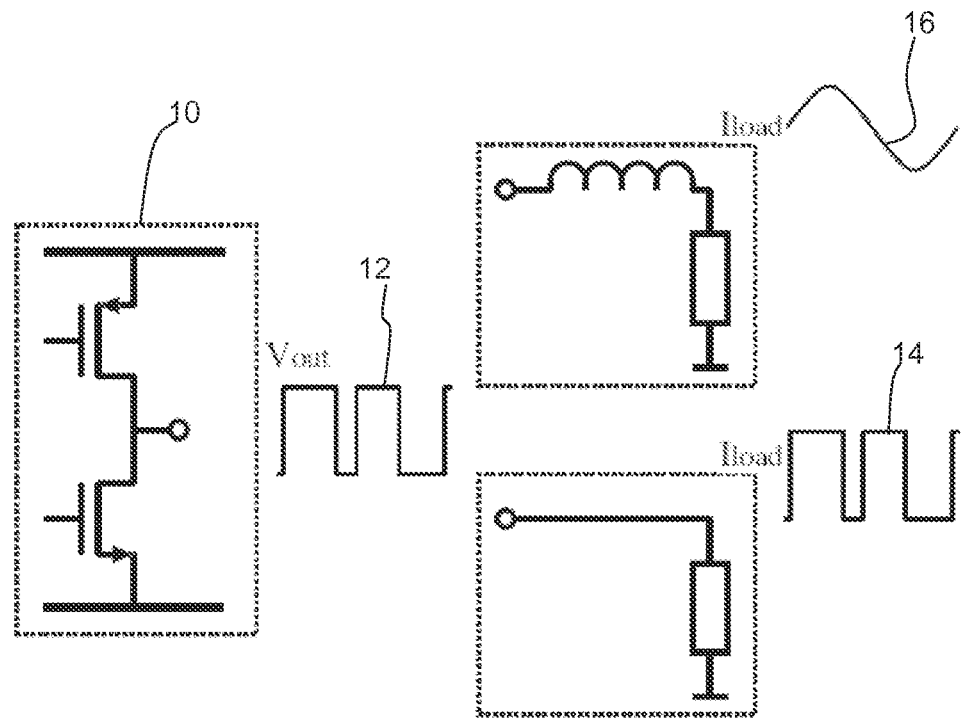
FIG. 1 shows how a PWM signal can be generated and filtered or not filtered.
Figure 2:
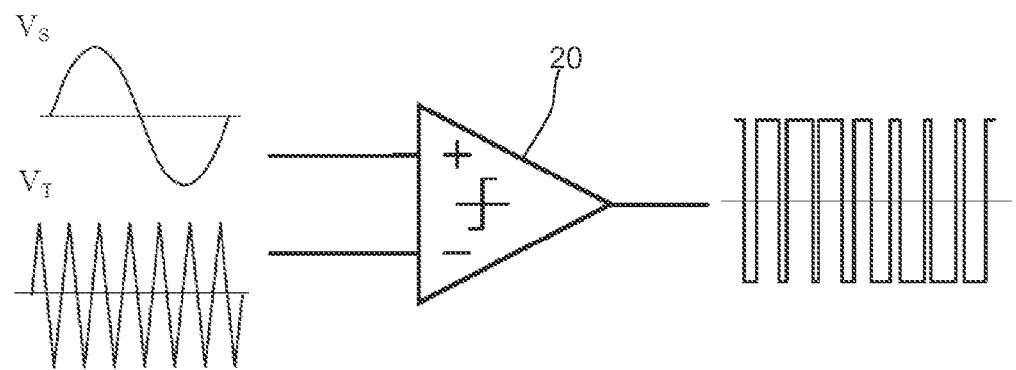
FIG. 2 shows the principle of operation of a known class D amplifier circuit.
Figure 3:
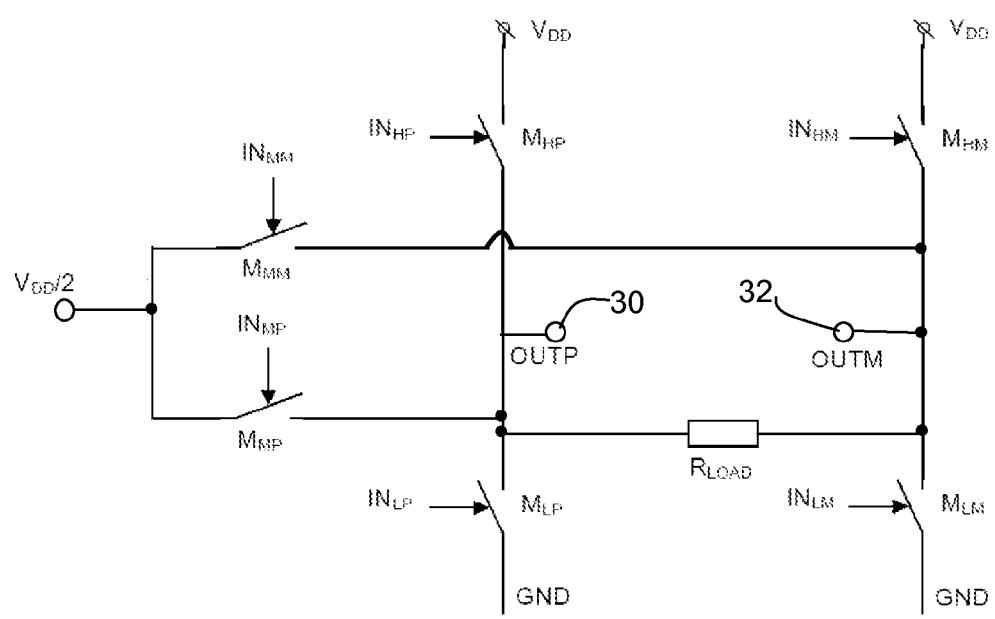
FIG. 3 shows a known implementation of 3-level class D amplifier circuit.
Figure 4:
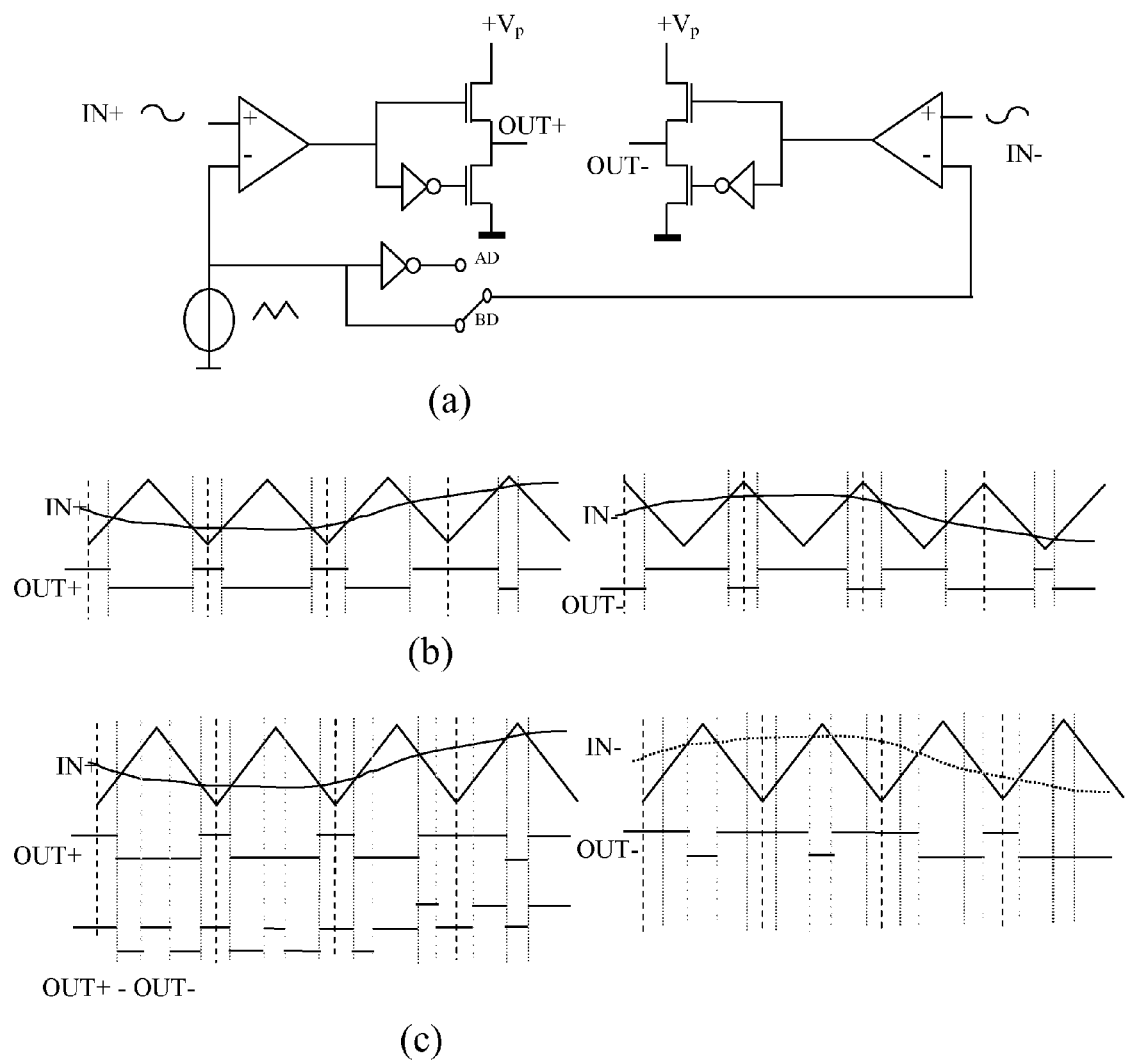
FIG. 4 shows how a bridge tied load (BD) configuration can provide a three level control compared to a two level (AD) configuration.

The additional components comprise a 180 degree phase shift circuit 60 applied to the output "osc" of the oscillator. The third integrator 46a generates the second triangular waveform Vt2, and a second comparator 50a compares this with the input signal Vi (after feedback correction). The two comparators 50,50a together provide the control signals to the power stage 52 to generate a 3-level PWM signal. The power stage 52 can for example comprise a single 3 voltage level power stage, for example the set of switches $M_{HP}$, $M_{LP}$ and $M_{MP}$ as shown in FIG. 3, to define a three level output.

In a 3-level output switch circuit, voltages 0, Vdd and Vdd/2 are each selectively switched to the output. The switches can be implemented by transistors with their parallel back gate diodes.

As shown in FIG. 6, a gain of ½ can be applied to give the output signal the same voltage swing as the individual comparator output signals.

The third integrator 46a is also provided with a feedback signal via impedance 48a, so that second order control is implemented for each comparator 50,50a.

The circuit of FIG. 7 shares the voltage to current converter 40 and the first order feedback loop 44.

The second order feedback implemented by the impedances 48,48' is optional. However, by implementing second order feedback control, the control loop of FIG. 7 further reduces the effect of the Pulse Timing Errors [PTE] and Pulse Amplitude Errors [PAE] on the three level power stage.

The oscillator node can be connected to a non-phase shifted or to a 90° phase shifted reference oscillator. The 180° phase-shift applied to the oscillator signal can instead be applied to the input signal or to the output current signal of the voltage to current converter 40. Thus, the circuit function can be implemented with different signals being phase shifted to those shown to achieve the same relative phase differences between the signals being compared at the two comparators, as will be immediately apparent to those skilled in the art.

Two of the circuits of FIG. 7 together provide the required control circuitry for a 5-level class D amplifier. As shown in FIG. 6, one circuit has the reference oscillator 90 degree phase shifted with respect the other and the input signal 180 degree phase shifted. Again, providing each comparator makes the appropriate signal comparison, the phase shifts can be implemented differently.

In the circuit of FIG. 6, the four comparisons are:

Input vs triangular waveform (0 degree relative phase difference)

Input vs 180 degree shifted triangular waveform (+180 degree relative phase difference)

180 degree shifted input vs 90 degree shifted triangular waveform (+270 degree relative phase difference)

180 degree shifted input vs 270 degree shifted triangular waveform (+90 degree relative phase difference)

It can be seen that the circuit essentially provides the four possible relative phase differences which are multiples of 90 degrees, and these four comparisons are then combined to derive the 5-level signal. Each 3-level control circuit uses one pair of these comparison signals.

The control loop can be used or adapted for other N-voltage level class-D systems, for example for use in motor drivers.

Figure 8:
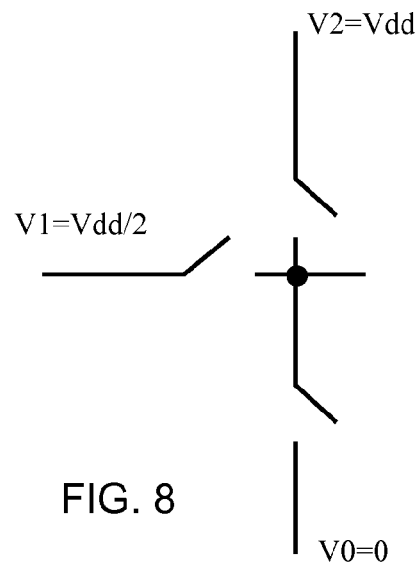
FIG. 8 shows schematically a 3 level output circuit.

FIG. 8 shows in schematic form a 3 level output circuit, such as present in power stage 52 of FIG. 7.

Figure 9:
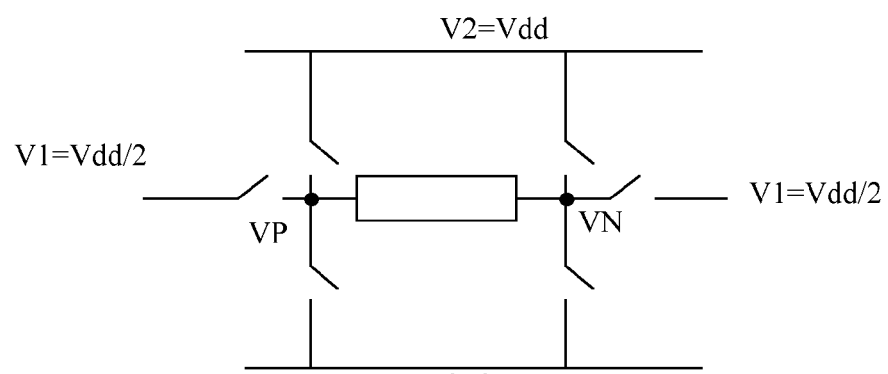
FIG. 9 shows how two 3-level output circuits can be combined in a bridge tied load configuration.

FIG. 9 shows in simplified schematic form how the two 3-level circuits are combined in a bridge tied load configuration. This corresponds to the circuit of FIG. 3. The output voltage is defined as VP−VN, and each node P and N can be switched to three voltage levels.

If these voltage levels are equally spaced, such as 0, Vdd/2 and Vdd, then the output voltage can take values −Vdd, −Vdd/2, 0, Vdd/2 and Vdd to implement a 5-level system.

However, if the reference voltages are not equally spaced, a 7 level system can be formed. For example if VP and VN can each can take values 0, Vdd/3 and Vdd, then the output voltage can take values −Vdd, −2Vdd/3, −Vdd/3, 0, Vdd/3, 2Vdd/3 and Vdd.

The circuit of FIG. 7 can also be extended to provide more levels. For example a 5 level output can be generated by providing two further comparators (which would then be 50b and 50c) as well as their associated integrators (which would then be 46b and 46c). The integrators are each provided with a respective feedback path, with a respective feedback impedance (which would then be 48b and 48c) from the node 45.

The further (third and fourth) comparators again compare a signal derived from the input voltage signal with a respective triangular reference signal. The phase relationship between the signals to the third and fourth comparators is 90 degrees shifted relative to a phase relationship between the signals to the first and second comparators. In this way, the circuit implements all four phase relationships to derive a 5-level signal. The power stage 52 then comprises a five level output circuit.

As outlined above, for an N-level circuit, N−1 carriers are required. The circuit of FIG. 7 can be extended generally to provide N levels, with suitable phase relationships between the input signal and N−1 reference signals, and with N−1 integrator-comparator branches (46,50). The N−1 comparators receive an input signal and a reference signal, and the phase relationship between them is evenly spaced around 360 degrees (e.g. 0 and 180 degrees, or 0, 120 degrees and 240 degrees, or 0, 90 degrees, 180 degrees, 270 degrees, etc.). Again, each integrator-comparator branches can be provided with a second feedback impedance connected to node 45 (i.e. the output of the first integrator 42).

In the same way that two 3-level circuits can be combined to form a 5 level or 7 level circuit as in FIG. 9, two 4-level circuits can be combined to form a 7-level or 13 level circuit.

Figure 10:
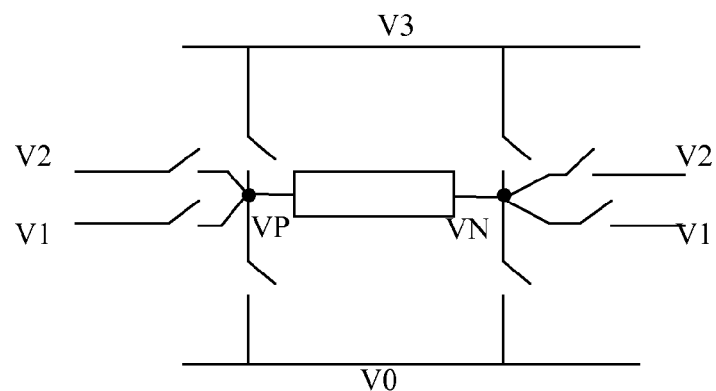
FIG. 10 shows how two 4-level output circuits can be combined in a bridge tied load configuration.

FIG. 10 shows how two 4-level circuits are combined. The output voltage is again defined as VP−VN, and each node P and N can be switched to three voltage levels.

If these voltage levels are equally spaced, such as 0, Vdd/3, 2Vdd/3 and Vdd, then the output voltage can take values −Vdd, −2Vdd/3, −Vdd/3, 0, Vdd/3, 2Vdd/3 and Vdd to implement a 7-level system.

However, if the reference voltages are not equally spaced, a 13 level system can be formed. For example if VP and VN can each take values 0, Vdd/4, 2Vdd/3 and Vdd, then the output voltage can take values:

Vdd, −9Vdd/12, −8Vdd/12, −5Vdd/12, −4Vdd/12, −3Vdd/12, 0, 3Vdd/12, 4Vdd/12, 5Vdd/12, 8Vdd/12, 9Vdd/12, Vdd.

This implements a 13 level system.

It can be seen that the basic 3-level system (as shown in FIG. 7) can be used for a 3-level system, or it can be combined in bridge tied load configuration to define a 5 level system (with V1=Vdd/2) or a 7 level system (if V1≠Vdd/2). Within a three level system, if V1=0 or V1=Vdd (or more generally if V1=V0 or V1=V2), then the system becomes a two level system, but still benefiting from the feedback control of the invention.

The feedback path impedances 44,48,48a are typically resistors, functioning as passive voltage to current converters. These feedback paths do not introduce the minimum amount of extra offset or noise to the input compared to a active feedback path.

The triangular waveform frequency, called the switching frequency, is typically in the range 250 kHz to 700 kHz and the bandwidth for the input signal is in one example the audio bandwidth: 20 Hz to 20 kHz, and thereby much lower than the switching frequency.

The second order feedback impedances 48,48a are not essential but they give a higher loop gain which gives better suppression of the errors introduced by the power stage.

Various other modifications will be apparent to those skilled in the art.

The invention claimed is:

1. An N-level class D amplifier circuit comprising:
   a first comparator for comparing a first signal derived from an input voltage signal with a first reference signal that is a first triangular waveform;
   a second comparator for comparing a second signal derived from the input voltage signal with a second reference signal that is a second triangular waveform, wherein a phase relationship between the signals to the first comparator is phase shifted relative to a phase relationship between the signals to the second comparator;
   an amplifier stage for generating an N-level PWM output signal;
   a controller for controlling an amplifier stage based on the outputs of the first and second comparators; and
   a feedback path from the N-level PWM output signal;
   wherein the first triangular waveform is generated by a first triangular waveform generator and the second triangular waveform is 180 degrees out of phase with respect to the first triangular waveform and is generated by a second triangular waveform generator.

2. A circuit as claimed in claim 1, further comprising a voltage to current converter at an input of the circuit to generate an input current, and a first integrator for converting a difference between the input current and feedback current to a voltage, wherein the feedback path connects to an output of the voltage to current converter.

3. A circuit as claimed in claim 2, wherein the output of the voltage to current converter is supplied to the first and second comparators.

4. A circuit as claimed in claim 1, wherein the first triangular waveform generator comprises a second integrator which receives at its input a square wave oscillator signal.

5. A circuit as claimed in claim 4, further comprising a first feedback impedance between an output of the first integrator and an input of the second integrator.

6. A circuit as claimed in claim 4, wherein the second triangular waveform generator comprises a third integrator which receives at its input a 180 degree phase shifted version of the square wave oscillator signal.

7. A circuit as claimed in claim 6, further comprising a second feedback impedance between the output of the first integrator and the input to the third integrator.

8. A circuit as claimed in claim 2, wherein the feedback path comprises a feedback impedance coupled between the circuit output and the input to the first integrator.

9. A circuit as claimed in claim 1, wherein N=3 and a phase relationship between the signals to the first comparator is 180 degrees shifted relative to a phase relationship between the signals to the second comparator.

10. A 5-level class D amplifier circuit comprising:
   a first 3-level class D amplifier circuit and a second 3-level class D amplifier circuit, each as claimed in claim 9;
   wherein an output of one of the 3-level class D amplifier circuits is subtracted from the other, and wherein each 3-level class D amplifier circuit provides three equally spaced voltage levels.

11. A circuit as claimed in claim 10, wherein the first and second reference signals of one of the 3-level class D amplifier circuits are shifted by 90 degrees with respect to the first and second reference signals of the other of the 3-level class D amplifier circuits.

12. A 7-level class D amplifier circuit comprising:
   a first 3-level class D amplifier circuit and a second 3-level class D amplifier circuit, each as claimed in claim 9;
   wherein an output of one of the 3-level class D amplifier circuits is subtracted from the other, and wherein each 3-level class D amplifier circuit provides an unequally spaced set of reference voltages.

\* \* \* \* \*